US011667007B2

(12) United States Patent
Sugiyama et al.

(10) Patent No.: US 11,667,007 B2
(45) Date of Patent: Jun. 6, 2023

(54) POLISHING APPARATUS AND POLISHING METHOD

(71) Applicant: EBARA CORPORATION, Tokyo (JP)

(72) Inventors: Mitsunori Sugiyama, Tokyo (JP); Taro Takahashi, Tokyo (JP); Yoichi Kobayashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 1268 days.

(21) Appl. No.: 16/162,914

(22) Filed: Oct. 17, 2018

(65) Prior Publication Data

US 2019/0118332 A1 Apr. 25, 2019

(30) Foreign Application Priority Data

Oct. 19, 2017 (JP) .............................. JP2017-202620

(51) Int. Cl.
| | |
|---|---|
| *B24B 37/013* | (2012.01) |
| *B24B 37/12* | (2012.01) |
| *B24B 49/12* | (2006.01) |
| *B24B 57/02* | (2006.01) |
| *B24B 49/08* | (2006.01) |

(Continued)

(52) U.S. Cl.
CPC ........ *B24B 37/013* (2013.01); *B24B 27/0023* (2013.01); *B24B 37/105* (2013.01); *B24B 37/12* (2013.01); *B24B 37/205* (2013.01); *B24B 49/08* (2013.01); *B24B 49/12* (2013.01); *B24B 57/02* (2013.01); *H01L 21/30625* (2013.01)

(58) Field of Classification Search
CPC . B24B 27/0023; B24B 37/013; B24B 37/105; B24B 37/12; B24B 37/205; B24B 49/08; B24B 49/12; B24B 57/02; B24B 37/042; B24B 49/00; B24B 49/04; B24B 37/005; B24B 37/00; B24B 37/04; B24B 37/10; B24B 7/228; B24B 49/02; B24B 49/10; B24B 49/105; B24B 49/16; H01L 21/30625
USPC ........................................................ 451/5, 6
See application file for complete search history.

(56) References Cited

U.S. PATENT DOCUMENTS

2002/0016066 A1 2/2002 Birang et al.
2004/0235393 A1* 11/2004 Hirokawa ......... H01L 21/31053
451/6

(Continued)

FOREIGN PATENT DOCUMENTS

JP 2001-284300 A 10/2001
JP 2006-526292 A 11/2006

(Continued)

*Primary Examiner* — Anne M Kozak
*Assistant Examiner* — Arman Milanian
(74) *Attorney, Agent, or Firm* — BakerHostetler

(57) ABSTRACT

A polishing table holds a polishing pad. A top ring holds a semiconductor wafer. A swing arm holds the top ring. The swing arm swings around a swing center on the swing arm during polishing. An optical sensor is disposed on the polishing table and measures an optical characteristic changeable in accordance with a variation in film thickness of the semiconductor wafer. A fluid supply control apparatus determines a distance from an axis of rotation to the optical sensor when the semiconductor wafer is rotated by the top ring. An end point detection section detects a polishing end point indicating an end of polishing based on the optical characteristic measured by the optical sensor and the determined distance.

7 Claims, 11 Drawing Sheets

(51) Int. Cl.
  *B24B 37/10*   (2012.01)
  *B24B 37/20*   (2012.01)
  *B24B 27/00*   (2006.01)
  *H01L 21/306*   (2006.01)

(56) References Cited

U.S. PATENT DOCUMENTS

2010/0081361 A1* 4/2010 Fukuda ................ B24B 53/017
                                                            451/5
2010/0273396 A1* 10/2010 Kobayashi .............. B24B 49/00
                                                            451/5

FOREIGN PATENT DOCUMENTS

| | | |
|---|---|---|
| JP | 2008-503356 A | 2/2008 |
| JP | 2010-253627 A | 11/2010 |
| JP | 2012-135865 A | 7/2012 |
| WO | WO 2005/123335 A1 | 12/2005 |

* cited by examiner

POLISHING APPARATUS AND POLISHING METHOD

CROSS-REFERENCE TO RELATED APPLICATION

This application is based upon and claims benefit of priority from Japanese Patent Application No. 2017-202620 filed on Oct. 19, 2017, the entire contents of which are incorporated herein by reference.

TECHNICAL FIELD

The present invention relates to a polishing apparatus that polishes a surface of a polishing object and a polishing method for performing polishing using the polishing apparatus.

BACKGROUND ART

In recent years, with the progress of high-level integration of semiconductor devices, circuit wiring is becoming finer and inter-wire distances are also becoming smaller. Therefore, surfaces of semiconductor wafers which are polishing objects also need to be flattened, and polishing using chemical mechanical polishing (CMP) apparatuses is performed as means for the flattening method.

A polishing apparatus is provided with a polishing table for holding a polishing pad to polish a polishing object and a top ring for holding the polishing object and pressing it against a polishing pad. Rotations of the polishing table and the top ring are respectively driven by a drive section (e.g., a motor). The polishing object is polished by causing a liquid containing a polishing agent (slurry) to flow over the polishing pad and pressing the polishing object held to the top ring against the polishing pad. The top ring is held at an end of a swing arm. The swing arm can swing around a swing center of the swing arm.

When polishing of a polishing object by the polishing apparatus is not sufficient, insulation among circuits may not be secured and a short-circuit may occur. In the case of excessive polishing, problems arise such as that a cross section of wiring decreases, which may cause the resistance value to increase or the wiring itself may be completely removed or the circuit itself may not be formed. Furthermore, the entire surface needs to be flattened accurately. Thus, the polishing apparatus is required to detect an optimal polishing end point or detect the amount of polishing throughout the entire surface accurately.

Examples of such a technique include end point detection apparatuses using an optical end point detection sensor (hereinafter referred to as "optical sensor") described in National Publication of International Patent Application No. 2006-526292 and an eddy current end point detection sensor (hereinafter referred to as "eddy current sensor") described in Japanese Patent Laid-Open No. 2012-135865.

An end point detection apparatus for a polishing apparatus measures a state of a wafer that passes above a table using a sensor placed on the polishing table. When the sensor is attached to the polishing table, the sensor is placed such that the sensor passes through the center of the wafer. Every time the sensor passes under the wafer, the state of the wafer (eddy current in a metal film and surface characteristic of the film) is measured, a change in the state is detected and polishing is stopped or the polishing condition is changed. Depending on the type of the optical sensor, a liquid such as pure water is supplied to a fluid chamber provided in a light projecting/receiving part of the polishing table at the time of measurement.

The swing arm may or may not be swung during polishing. When the swing arm is not swung, the swing arm is stopped at a position where the sensor passes through the center of the wafer and polishing is performed. In this case, the track of the sensor on the wafer becomes curves of the same shape that pass through the center of the wafer. Times at which the sensor passes at the respective points on the curves have a one-to-one correspondence with the length of each curve from one end of the curve when times are measured from the one end of the curve. That is, when times are measured from one end of the curve, the radius from the center of the wafer at a place being measured by the sensor is uniquely determined. A change in the state of the wafer is detected by comparing measured values corresponding to the same radius.

When the swing arm is swung during polishing, the following problems are observed. When the top ring swings in a horizontal direction, the track of the sensor passing under the wafer becomes curves of various sizes that pass through points other than the center of the wafer different from the above-described curve. Therefore, when times are measured from one ends of these curves, the radius from the center of the wafer at a place being measured by the sensor cannot be uniquely determined. Even at the same time, the radius from the center of the wafer differs depending on each curve.

Since a change in the state of a wafer is detected by comparing measured values at the same radius, it is difficult to measure a change in the state of the wafer. In the case of a sensor that supplies a liquid to a fluid chamber, it is preferable to start supplying the liquid immediately before the sensor enters an area under the wafer and stop supplying the liquid immediately after the sensor comes out from below the wafer. When the swing arm is not swung during polishing, a period during which the sensor stays under the wafer when expressed by an angle of rotation of the table, starts always at a certain angle and always ends at a certain angle. For this reason, it is possible to easily detect the time at which the supply of a liquid starts and easily stop the supply.

However, when the swing arm is swung during polishing, the period during which the sensor stays under the wafer when expressed by the angle of rotation of the table, starts at times corresponding to various angles and ends at times corresponding to various angles. Therefore, the time at which the supply of a liquid starts changes, the supply period changes and the time at which the supply of a liquid ends changes. Therefore, it is not easy to start the liquid supply immediately before the sensor enters the area under the wafer and stop the liquid supply immediately after the sensor comes out from below the wafer.

CITATION LIST

Patent Literature

PTL 1: J National Publication of International Patent Application No. 2006-526292
PTL 2: Japanese Patent Laid-Open No. 2012-135865

SUMMARY OF INVENTION

Technical Problem

An aspect of the present invention has been implemented to solve the above-described problems and it is an object of the present invention to provide a polishing apparatus and a polishing method that can determine a radius from the center of a wafer at a place being measured by a sensor when a swing arm is swung during polishing.

Furthermore, an object according to another aspect of the present invention is to provide a polishing apparatus that can appropriately set supply timing of a liquid to a fluid chamber when a swing arm is swung during polishing.

Solution to Problem

In order to solve the above problems, a first aspect adopts a configuration of a polishing apparatus configured to perform polishing between a polishing pad and a polishing object disposed opposite to the polishing pad, including a rotatable polishing table configured to hold the polishing pad, a rotatable holding section configured to hold the polishing object, a swing arm holding the holding section, an arm drive section configured to swing the swing arm around a center of swinging on the swing arm during the polishing, a measuring section disposed on the polishing table, and configured to measure a physical quantity of the polishing object changeable in accordance with a change in film thickness of the polishing object, a distance determining section configured to determine a distance from an axis of rotation when the polishing object is rotated by the holding section, to the measuring section at the time of measurement by the measuring section, when the polishing object is swung around the center of swinging on the swing arm and rotated by the holding section, and an end point detection section configured to detect a polishing end point indicating an end of the polishing based on the physical quantity measured by the measuring section and the determined distance.

According to the present embodiment, since a distance determining section is provided for determining a distance from an axis of rotation when the polishing object is rotated by the holding section to the measuring section at the time of measurement by the measuring section, it is possible to determine the radius from the center of rotation of the polishing object (e.g., wafer) at a place being measured by the sensor when the swing arm is swung during polishing. Here, the "distance from the axis of rotation to the measuring section" is a length of the perpendicular line drawn from the measuring section to the axis of rotation.

There are various methods for detecting an end point of polishing indicating an end of polishing based on a physical quantity measured by the measuring section and the determined distance. For example, the polishing end point can be detected from a time variation in a physical quantity measured at a place where the determined distance is identical or a place located within a range (vicinity) where the determined distance is regarded to be identical. When the determined distance is identical, this means that the polishing object is at an identical radius from the center of rotation. Therefore, the method for detecting such a polishing end point means detecting points having an identical radius, that is, points on an identical circle without individually distinguishing among the points.

As another method for detecting a polishing end point indicating an end of polishing based on the physical quantity measured by the measuring section and the determined distance is averaging physical quantities at a plurality of measuring points at an identical radius from the center of rotation of a polishing object every time the polishing table makes one turn over a certain past period, that is, from a time variation of temporal average values.

Furthermore, the polishing end point may be detected by averaging physical quantities measured within a range (vicinity) where the determined distance is regarded to be identical or within a predetermined range, that is, from a time variation of spatial average values. Furthermore, a spatial average value and a temporal average value may be combined.

As a method for determining a polishing end point, the polishing endpoint can be determined, for example, from a magnitude relation between a predetermined reference value and a measured value or from a magnitude relation between a predetermined reference value and a time variation of the measured value (e.g., differential value).

Note that when the angle of rotation of the polishing object is detected by the holding section and the angle of rotation of the polishing object is determined, a plurality of points having an identical radius, that is, located on an identical circle can be distinguished individually. In this case, a polishing endpoint can be detected in consideration of polishing situations of individual objects to be polished in further detail.

According to a second aspect, the configuration of the polishing apparatus according to the first aspect is adopted in which the distance determining section is configured to determine the distance based on the angle of rotation of the measuring section at the time of measurement from a rotation position which becomes a reference when the measuring section rotates around the center of rotation of the polishing table and the swinging angle of the swing arm at the time of measurement from a swing position which becomes a reference when the swing arm swings around the center of swing.

According to a third aspect, the configuration of the polishing apparatus according to the first aspect is adopted in which the distance determining section is configured to determine the distance based on a time required for the measuring section to rotate from a rotation position which becomes a reference when the measuring section rotates around the center of rotation of the polishing table to a rotation position at the time of measurement and a time required for the swing arm to swing from a swing position which becomes a reference when the swing arm swings around the center of swing to a swing position at the time of measurement.

According to a fourth aspect, the configuration of the polishing apparatus according to any one of the first to third aspects is adopted in which the measuring section includes a light projecting/receiving apparatus configured to project measurement light from the polishing table onto the polishing object and receiving light reflected from the polishing object, a fluid supply section configured to supply a fluid to a fluid chamber provided at light projecting/receiving parts of the polishing table, and a fluid supply control apparatus configured to control the fluid supply to the fluid chamber, wherein the fluid supply control apparatus supplies the fluid when the determined distance falls within a predetermined range.

According to a fifth aspect, the configuration of the polishing apparatus according to the fourth aspect is adopted in which when the determined distance falls within the predetermined range, this means when the determined distance is equal to or less than a length obtained by adding up the radius of the polishing object and a predetermined length.

According to a sixth aspect, the configuration of the polishing apparatus according to the fourth or the fifth aspect is adopted in which the fluid supply control apparatus supplies the fluid with a first supply amount for a predetermined period from a time at which the fluid supply starts after the determined distance falls within the predetermined range and after a lapse of the predetermined period, supplies the fluid with a second supply amount which is smaller than the first supply amount.

According to a seventh aspect, a configuration of a polishing method is adopted which is a polishing method for performing polishing between a polishing pad and a polishing object disposed opposite to the polishing pad, the method including holding the polishing pad to a polishing table and rotating the polishing table, holding the polishing object to a holding section and rotating the holding section, holding the holding section using a swing arm and causing the swing arm to swing around a center of swinging on the swing arm during the polishing, measuring a physical quantity of the polishing object changeable in accordance with a change in film thickness of the polishing object using a measuring section disposed on the polishing table, determining a distance from an axis of rotation when the polishing object is rotated by the holding section, to the measuring section at the time of measurement by the measuring section, when the polishing object is swung around the center of swinging on the swing arm and rotated by the holding section, and detecting a polishing end point indicating an end of the polishing based on the measured physical quantity and the determined distance.

DESCRIPTION OF EMBODIMENTS

Figure 1:
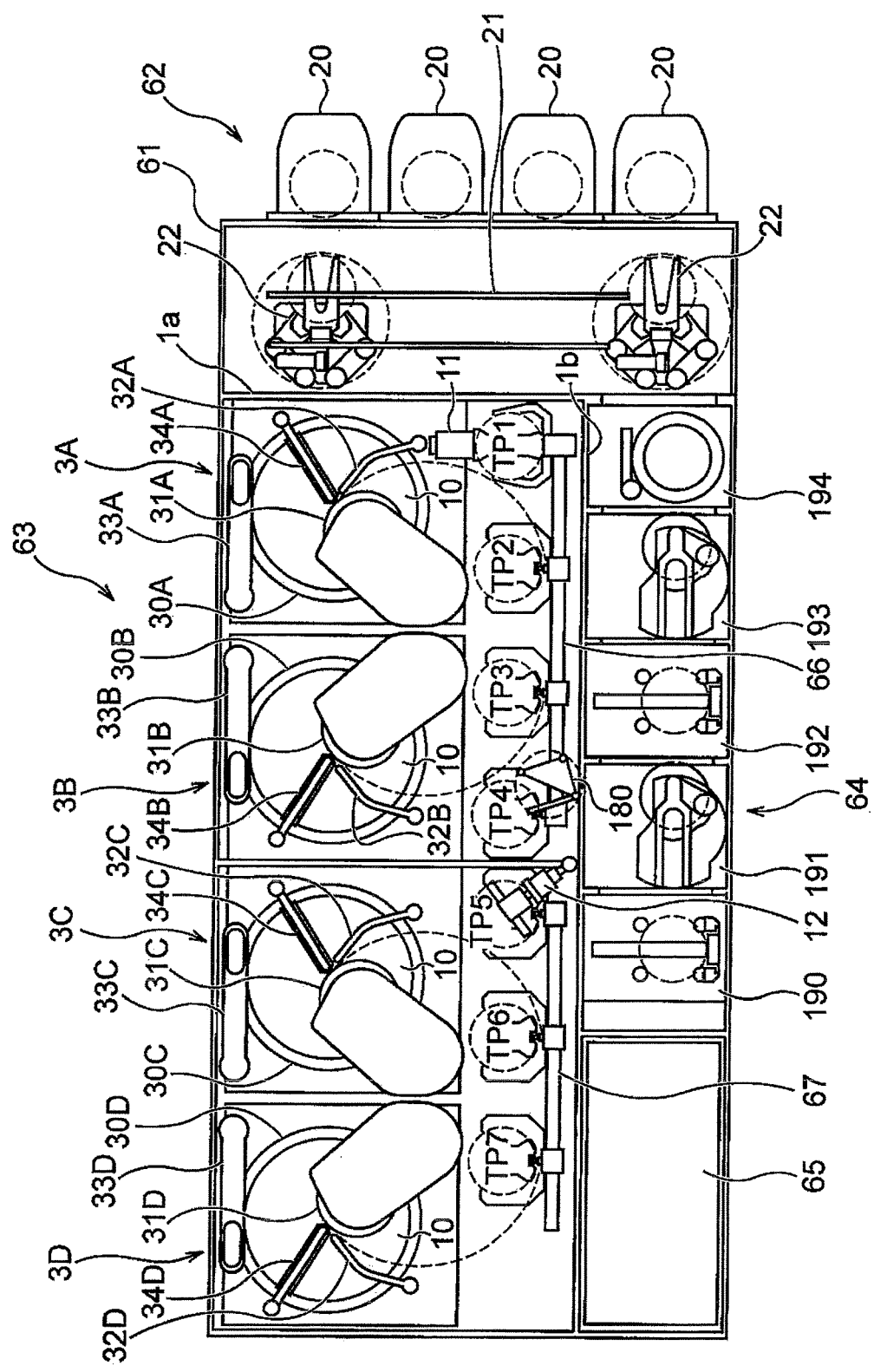
FIG. 1 is a plan view illustrating an overall configuration of a substrate processing apparatus according to an embodiment of the present invention.

Hereinafter, embodiments of the present invention will be described with reference to the accompanying drawings. Note that identical or corresponding members among the following embodiments are respectively assigned identical or corresponding reference numerals and overlapping description will be omitted.

FIG. 1 is a plan view illustrating an overall configuration of a substrate processing apparatus according to an embodiment of the present invention. As shown in FIG. 1, this substrate processing apparatus is provided with a substantially rectangular housing 61. An interior of the housing 61 is divided by partition walls 1a and 1b into a loading/unloading section 62, a polishing section 63 and a cleaning section 64. The loading/unloading section 62, the polishing section 63 and the cleaning section 64 are independently assembled and an exhausted gas is discharged from these sections independently. Furthermore, the substrate processing apparatus includes a control section 65 that controls a substrate processing operation.

The loading/unloading section 62 is provided with two or more (four in the present embodiment) front loading sections 20 in which a wafer cassette for stocking many wafers (substrates) is placed. These front loading sections 20 are arranged adjacent to the housing 61 and arrayed along a width direction of the substrate processing apparatus (direction perpendicular to a longitudinal direction). The front loading section 20 is enabled to mount an open cassette, an SMIF (standard manufacturing interface) pod or a FOUP (front opening unified pod). Here, the SMIF and FOUP are airtight containers that house a wafer cassette, cover it with a partition wall and can thereby keep an environment independent of an external space.

A traveling mechanism 21 is laid on the loading/unloading section 62 along a row of the front loading sections 20. Two transport robots (loaders) 22 which are movable along the array direction of wafer cassettes are set on the traveling mechanism 21. The transport robots 22 are enabled to access a wafer cassette mounted on the front loading section 20 by moving on the traveling mechanism 21. Each transport robot 22 is provided with two upper/lower hands. The upper hand is used to return a processed wafer to the wafer cassette. The lower hand is used to extract a wafer before processing from the wafer cassette. Thus, the upper and lower hands are used for different purposes. The lower hand of the transport robot 22 can further invert the wafer by causing it to rotate around its center of axis.

The loading/unloading section 62 is a region that needs to be kept in a cleanest state. Therefore, the inside of the loading/unloading section 62 is maintained under a higher pressure than outside the substrate processing apparatus, the polishing section 63, and the cleaning section 64 all the time. The polishing section 63 uses slurry as a polishing liquid, and is therefore a dirtiest region. Therefore, a negative pressure is formed inside the polishing section 63 and the pressure thereof is kept lower than an inner pressure of the cleaning section 64. The loading/unloading section 62 is provided with a filter fan unit (not shown) including clean air filters such as HEPA filter, ULPA filter or chemical filter. Clean air from which particles, poisonous steam or poisonous gas is removed is blown out from the filter fan unit all the time.

The polishing section 63 is a region where a wafer is polished (flattened) and is provided with a first polishing unit 3A, a second polishing unit 3B, a third polishing unit 3C and a fourth polishing unit 3D. The first polishing unit 3A, the second polishing unit 3B, the third polishing unit 3C and the fourth polishing unit 3D are arrayed along a longitudinal direction of the substrate processing apparatus as shown in FIG. 1.

As shown in FIG. 1, the first polishing unit 3A is provided with a polishing table 30A, a top ring 31A, a polishing liquid supply nozzle 32A, a dresser 33A and an atomizer 34A. A polishing pad 10 having a polishing surface is attached to the polishing table 30A. The top ring (holding section) 31A holds a wafer and polishes the wafer while pressing the wafer against the polishing pad 10 on the polishing table 30A. The polishing liquid supply nozzle 32A supplies a polishing liquid or a dressing liquid (e.g., pure water) to the polishing pad 10. The dresser 33A dresses the polishing surface of the polishing pad 10. The atomizer 34A sprays a mixed fluid of a liquid (e.g., pure water) and a gas (e.g., nitrogen gas) or a liquid (e.g., pure water) to the polishing surface in mist form.

Similarly, the second polishing unit 3B is provided with a polishing table 30B to which the polishing pad 10 is attached, a top ring 31B, a polishing liquid supply nozzle 32B, a dresser 33B and an atomizer 34B. The third polishing unit 3C is provided with a polishing table 30C to which the polishing pad 10 is attached, a top ring 31C, a polishing liquid supply nozzle 32C, a dresser 33C and an atomizer 34C. The fourth polishing unit 3D is provided with a polishing table 30D to which the polishing pad 10 is attached, a top ring 31D, a polishing liquid supply nozzle 32D, a dresser 33D and an atomizer 34D.

Since the first polishing unit 3A, the second polishing unit 3B, the third polishing unit 3C and the fourth polishing unit 3D have the same configuration, detailed description of the polishing unit will be focused on the first polishing unit 3A.

Next, a transport mechanism for transporting a substrate will be described. The transport mechanism is provided with a lifter 11, a first linear transporter 66, a swing transporter 12, a second linear transporter 67 and a temporary stand 180.

The lifter 11 receives a substrate from the transport robot 22. The first linear transporter 66 transports the substrate received from the lifter 11 between the first transport position TP1, the second transport position TP2, the third transport position TP3, and the fourth transport position TP4. The first polishing unit 3A and the second polishing unit 3B receive the substrate from the first linear transporter 66 and polish the substrate. The first polishing unit 3A and the second polishing unit 3B pass the received polished substrates to the first linear transporter 66.

The swing transporter 12 delivers the substrate between the first linear transporter 66 and the second linear transporter 67. The second linear transporter 67 transfers the substrate received from the swing transporter 12 between the fifth transport position TP5, the sixth transport position TP6 and the seventh transport position TP7. The third polishing unit 3C and the fourth polishing unit 3D receive the substrate from the second linear transporter 67 and polish the substrate. The third polishing unit 3C and the fourth polishing unit 3D pass the polished substrate to the second linear transporter 67. The substrate polished by the polishing unit 3 is placed on the temporary stand 180 by the swing transporter 12.

A cleaning unit 4 is a unit for cleaning and drying the substrate polished by the polishing unit 3. The cleaning unit 4 is provided with a first cleaning chamber 190, a first transport chamber 191, a second cleaning chamber 192, a second transport chamber 193 and a drying chamber 194.

The substrate placed on the temporary stand 180 is transported to the first cleaning chamber 190 or the second cleaning chamber 192 via the first transport chamber 191. The substrate is cleaned in the first cleaning chamber 190 or the second cleaning chamber 192. The substrate cleaned in the first cleaning chamber 190 or the second cleaning chamber 192 is transported to the drying chamber 194 via the second transport chamber 193. The substrate is dried in the drying chamber 194. The dried substrate is extracted from the drying chamber 194 and returned to the cassette by the transport robot 22.

Figure 2:
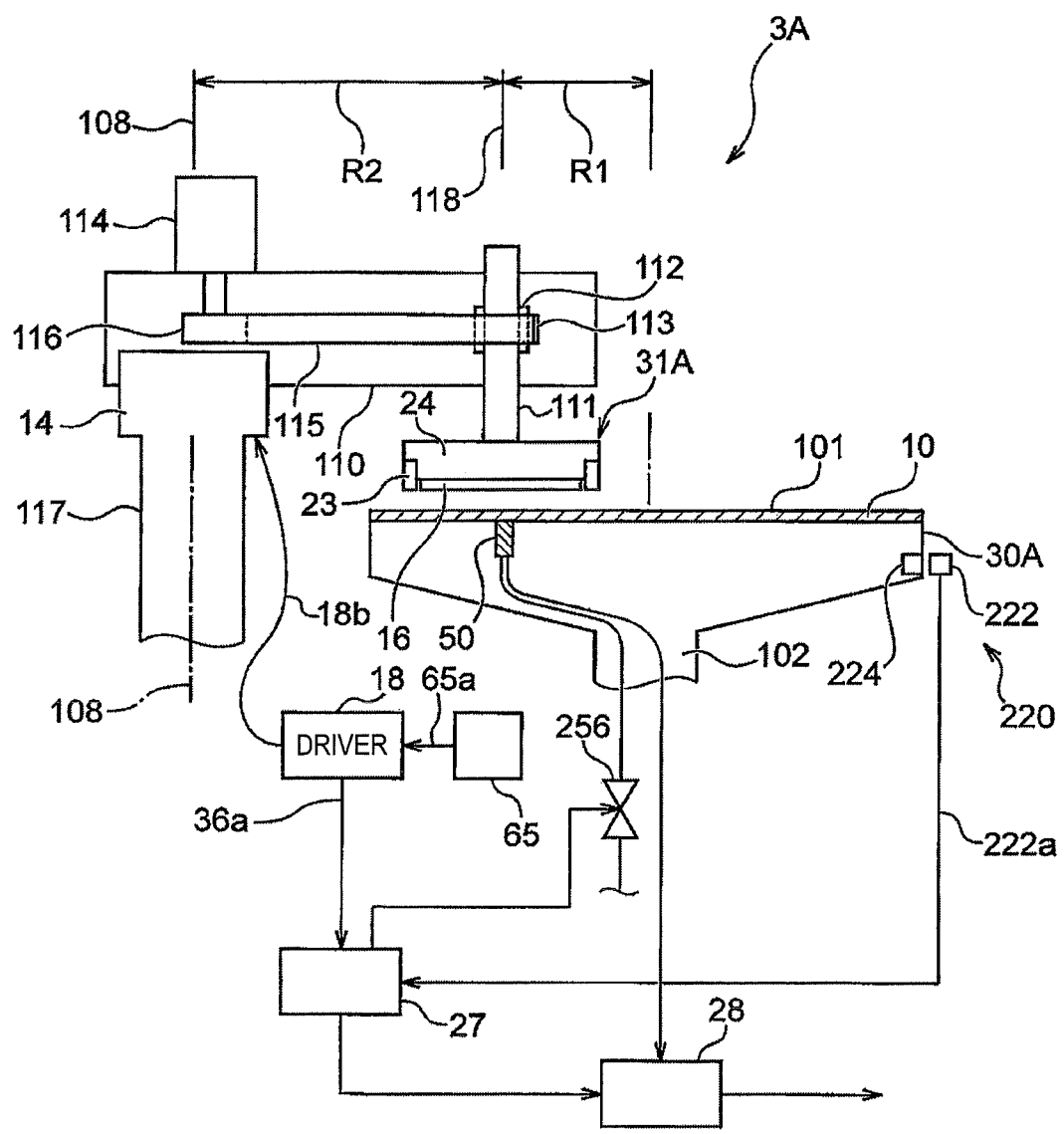
FIG. 2 is a schematic diagram illustrating an overall configuration of a polishing apparatus according to the embodiment of the present invention.

FIG. 2 is a schematic diagram illustrating an overall configuration of a polishing unit (polishing apparatus) according to the present invention. As shown in FIG. 2, the polishing apparatus is provided with a polishing table 30A and a top ring 31A that holds a substrate such as a semiconductor wafer which is a polishing object and presses the substrate against a polishing surface on the polishing table.

The first polishing unit 3A is a polishing unit for performing polishing between the polishing pad 10 and the semiconductor wafer 16 placed opposite to the polishing pad 10. The first polishing unit 3A includes the polishing table 30A for holding the polishing pad 10 and the top ring 31A for holding the semiconductor wafer 16. The first polishing unit 3A includes a swing arm 110 for holding the top ring 31A, a swing shaft motor 14 (arm drive section) for swinging the swing arm 110 and a driver 18 for supplying drive power to the swing shaft motor 14.

The first polishing unit 3A further includes a fluid supply control apparatus 27 and an end point detection section 28. The fluid supply control apparatus 27 receives an angle of rotation 36a of a swing arm shaft 117 from an encoder 36 (arm position detection section) incorporated in and attached to the swing shaft motor 14. The fluid supply control apparatus 27 controls a fluid supply section for supplying a fluid to a through hole 268 (fluid chamber: see FIG. 5) provided in a light projecting/receiving part of the polishing table 30A and thereby controls the fluid supply to the through hole 268. The fluid supply control apparatus 27 obtains information 222a relating to a rotation position of the polishing table 30A from a proximity sensor 222. The fluid supply control apparatus 27 controls the fluid supply to the through hole 268 from the angle of rotation 36a and information 222a.

The fluid supply control apparatus 27 is a distance determining section for determining a distance from an axis of rotation 108 when the semiconductor wafer 16 is rotated by the top ring 31A to the optical sensor 50 at the time of measurement by the optical sensor 50.

The fluid supply control apparatus 27 further outputs the information 222a to the end point detection section 28. Details of the proximity sensor 222, the fluid supply control apparatus 27 and the distance determining section will be described later. The end point detection section 28 detects a polishing end point indicating an end of polishing based on the angle of rotation 36a and the information 222a.

In the embodiment in FIG. 1, the holding section, the swing arm, the arm drive section and the torque detection section form a set, and sets having the same configuration are provided for the first polishing unit 3A, the second polishing unit 3B, the third polishing unit 3C and the fourth polishing unit 3D respectively.

The polishing table 30A is connected to a motor (not shown) which is a drive section disposed therebelow via a table shaft 102 and is enabled to rotate around the table shaft 102. The polishing pad 10 is pasted to the top surface of the polishing table 30A and a surface 101 of the polishing pad 10 constitutes a polishing surface for polishing the semiconductor wafer 16. The polishing liquid supply nozzle (not shown) is placed above the polishing table 30A and a polishing liquid supply nozzle supplies a polishing liquid to the polishing pad 10 on the polishing table 30A. As shown in FIG. 2, the optical sensor 50 may be embedded in the polishing table 30A.

The top ring 31A is constructed of a top ring body 24 that presses the semiconductor wafer 16 against the polishing surface 101 and a retainer ring 23 that holds an outer circumferential edge of the semiconductor wafer 16 so as to prevent the semiconductor wafer 16 from jumping out of the top ring.

The top ring 31A is connected to a top ring shaft 111. The top ring shaft 111 moves up and down relative to the swing arm 110 by an upward/downward moving mechanism (not shown). The upward/downward motion of the top ring shaft 111 causes the whole top ring 31A to ascend or descend relative to the swing arm 110 and positions the top ring 31A.

Furthermore, the top ring shaft 111 is connected to a rotary cylinder 112 via a key (not shown). The rotary cylinder 112 is provided with a timing pulley 113 at an outer circumferential part. A top ring motor 114 is fixed to the swing arm 110. The timing pulley 113 is connected to a timing pulley 116 provided for the top ring motor 114 via a timing belt 115. When the top ring motor 114 rotates, the rotary cylinder 112 and the top ring shaft 111 jointly rotate via the timing pulley 116, the timing belt 115, and the timing pulley 113, and the top ring 31A rotates.

The swing arm 110 is connected to the axis of rotation 108 of the swing shaft motor 14. The swing shaft motor 14 is fixed to the swing arm shaft 117. Therefore, the swing arm 110 is rotatably supported to the swing arm shaft 117.

The top ring 31A can hold a substrate such as the semiconductor wafer 16 on an undersurface thereof. The swing arm 110 is rotatable around the axis of rotation 108 of the swing arm shaft 117. As the swing arm 110 rotates, the top ring 31A holding the semiconductor wafer 16 to the undersurface is moved from the position at which the semiconductor wafer 16 is received to a position above the polishing table 30A. The swing arm 110 causes the top ring 31A to descend and presses the semiconductor wafer 16 against the surface (polishing surface) 101 of the polishing pad 10. At this time, the top ring 31A and the polishing table 30A are caused to rotate respectively. The semiconductor wafer 16 rotates around the rotation center 118 of the top ring shaft 111. That is, the rotation center 118 is the rotation center of the semiconductor wafer 16.

The polishing liquid supply nozzle provided above the polishing table 30A supplies the polishing liquid to the polishing pad 10. In this way, the semiconductor wafer 16 is brought into slidable contact with the polishing surface 101 of the polishing pad 10 and the surface of the semiconductor wafer 16 is thereby polished. The swing arm may or may not be swung during polishing. According to the present embodiment, the swing arm is swung during polishing.

The first polishing unit 3A includes a table drive section (not shown) that drives rotation of the polishing table 30A. The first polishing unit 3A may include a table torque detection section (not shown) that detects table torque applied to the polishing table 30A. The table torque detection section can detect table torque from a current of the table drive section which is a rotation motor. The endpoint detection section 28 may detect a polishing endpoint indicating an end of polishing only from an optical characteristic detected by the optical sensor 50 or detect a polishing end point indicating an end of polishing with the table torque detected by the table torque detection section also taken into consideration.

In FIG. 2, the arm drive section is the swing shaft motor (rotation motor) 14 that causes the swing arm 110 to rotate. The driver 18 supplies a current having a current value 18b to the swing shaft motor 14.

Figure 3:
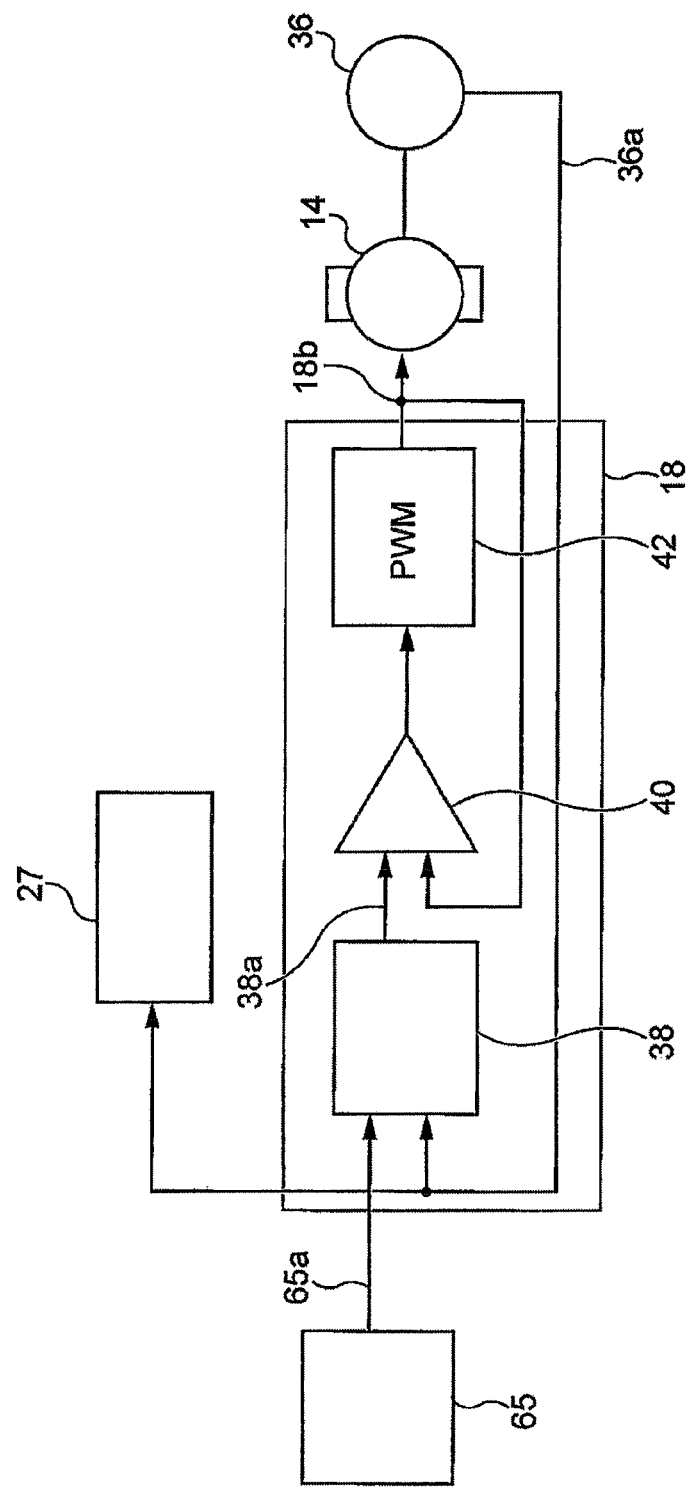
FIG. 3 is a block diagram illustrating a method for detecting a swinging angle of a swing arm.

The driver 18 will be described using FIG. 3. The driver 18 receives a position command 65a relating to the position of the swing arm 110 from the control section 65. The position command 65a is data corresponding to an angle of rotation of the swing arm 110 with respect to the swing arm shaft 117. The driver 18 also receives an angle of rotation 36a of the swing arm shaft 117 from the encoder 36 incorporated in and attached to the swing shaft motor 14.

The encoder 36 can detect the angle of rotation 36a of the axis of rotation of the swing shaft motor 14, that is, the angle of rotation 36a of the swing arm shaft 117. The angle of rotation 36a is the aforementioned information 222a. In FIG. 3, the swing shaft motor 14 and the encoder 36 are shown as independent entities, but the swing shaft motor 14 and the encoder 36 are actually unified as one body. An example of such an integrated motor is a synchronous AC servo motor with a feedback encoder.

The driver 18 includes a deviation circuit 38, a current generation circuit 40 and a PWM circuit 42. The deviation circuit 38 calculates a deviation 38a between the position command 65a and the angle of rotation 36a from the position command 65a and the angle of rotation 36a. The deviation 38a and the current value 18b are inputted to the current generation circuit 40. The current generation circuit 40 generates a current command 18a corresponding to the deviation 38a from the deviation 38a and an actual current value 18b. The PWM circuit 42 receives the current command 18a and generates the current value 18b through PWM (pulse width modulation) control. The current value 18b is a 3-phase (U-phase, V-phase, W-phase) current that can drive the swing shaft motor 14. The current value 18b is supplied to the swing shaft motor 14. The driver 18 outputs the angle of rotation 36a to the end point detection section 28.

Figure 4:
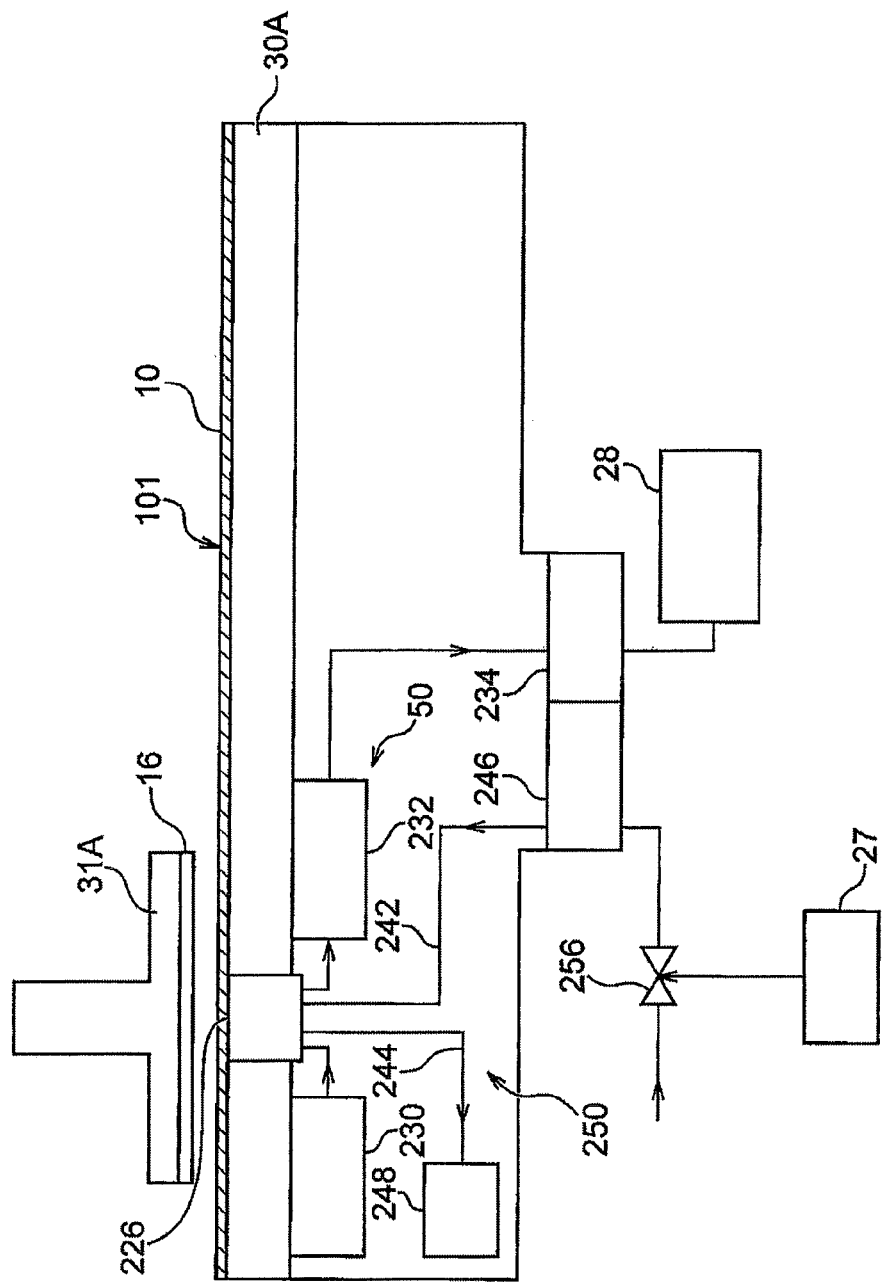
FIG. 4 is a diagram illustrating a polishing apparatus according to the embodiment of the present invention.

A fluid supply section 250 for supplying a fluid to the optical sensor 50 (measuring section) and the through hole 268 will be described using FIG. 4. The optical sensor 50 is disposed at the polishing table 30A, and configured to measure a physical quantity of the semiconductor wafer 16 which is changeable depending on a change in film thickness of the semiconductor wafer 16. The film to be measured is, for example, a silicon oxide film. The optical sensor 50 is incorporated in the polishing table 30A. Furthermore, the optical sensor 50 includes a light source unit 230 and a photometer unit 232 provided inside the polishing table 30A.

The light source unit 230 supplies measurement light to a sensor body 226, and the measurement light is radiated by the sensor body 226 onto the semiconductor wafer 16. The sensor body 226 receives reflected light from the semiconductor wafer 16 and sends the reflected light to the photometer unit 232. Members for transmitting the measurement light and the reflected light are both optical fibers. The photometer unit 232 converts an optical signal to an electric signal. The electric signal is processed by the end point detection section 28. The light projecting/receiving apparatus for projecting measurement light from the polishing table 30A onto the semiconductor wafer 16 and receiving reflected light from the semiconductor wafer 16 includes a light projecting optical fiber 270 which will be described later in the sensor body 226, a light receiving optical fiber 272, a light source unit 230 and the photometer unit 232.

The photometer unit 232 is connected to the end point detection section 28 via a rotary connector 234. The end point detection section 28 calculates optical indices such as film thickness, reflection intensity or spectrum. Furthermore, the end point detection section 28 determines optical indices such as film thickness, and performs end point detection as to whether or not film thickness has reached a predetermined value. The determination result is sent to a polishing control section (not shown) that controls the whole first polishing unit 3A.

The optical sensor 50 further includes a supply path 242 for supplying a measurement fluid to the through hole 268 and an exhaust path 244 for exhausting the measurement fluid from the through hole 268. The supply path 242 is connected to a tank (not shown) via a rotary joint 246. Furthermore, the exhaust path 244 is connected to a pump 248 that exhausts a fluid in a measurement chamber (fluid chamber). The pump 248 exhausts the measurement fluid and also exhausts a polishing liquid such as slurry to be flown into the measurement chamber. The supply path 242, the exhaust path 244, the tank and the pump 248 constitute a fluid supply section for supplying the fluid to the through hole 268.

In the present embodiment, the measurement fluid is pure water, and the pure water may be supplied from a tank provided in facilities such as a factory in which the substrate polishing apparatus is installed. Furthermore, the supply path 242 and the exhaust path 244 are constructed of appropriate pipes or the like. By coating the pipes with resin (non-metal member) such as polyether ether ketone (PEEK material), it is possible to prevent metal contamination to the substrate. The supply control valve 256 is a solenoid valve including a solenoid valve unit (not shown).

Figure 5:
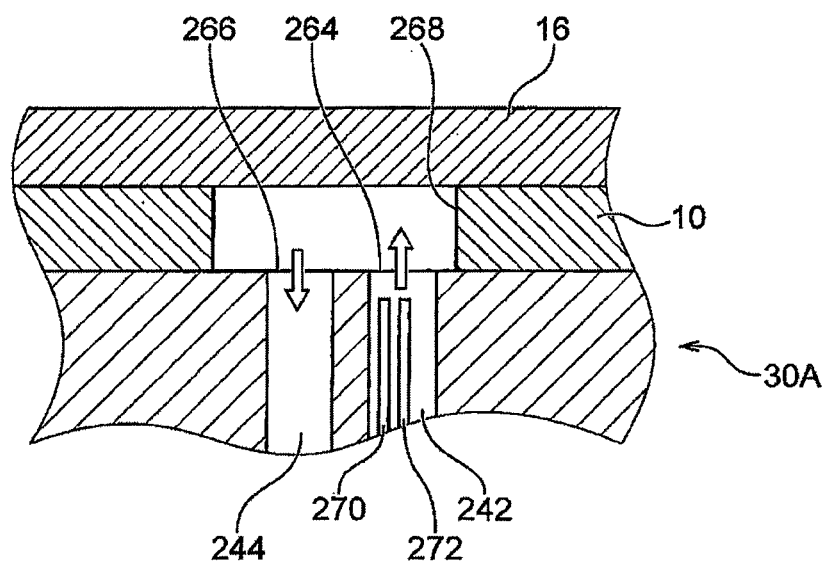
FIG. 5 is a diagram illustrating a configuration example of a sensor body provided for the polishing apparatus in FIG. 4.

FIG. 5 illustrates a configuration example of the sensor body 226. As has been already described, the polishing pad 10 is placed on the polishing table 30A and the semiconductor wafer 16 is in contact with the polishing pad 10. The supply path 242 and the exhaust path 244 are provided side by side in the polishing table 30A. A supply port 264 of the supply path 242 and an exhaust port 266 of the exhaust path 244 are located on the top surface of the polishing table 30A. The polishing pad 10 includes a through hole 268 through which the supply port 264 and the exhaust port 266 are exposed.

The light projecting optical fiber 270 and the light receiving optical fiber 272 are disposed side by side in the supply path 242. The light projecting optical fiber 270 and the light receiving optical fiber 272 are connected to the light source unit 230 and the photometer unit 232 (FIG. 4). The light projecting optical fiber 270 radiates the measurement light supplied from the light source unit 230 onto the semiconductor wafer 16. The light receiving optical fiber 272 receives the reflected light from the semiconductor wafer 16 and transmits the reflected light to the photometer unit 232. The light projecting optical fiber 270, the light receiving optical fiber 272, the light source unit 230 and the photometer unit 232 constitute the light projecting/receiving apparatus.

In the through hole 268, the measurement fluid such as pure water is supplied from the supply port 264 and exhausted from the exhaust port 266. The interior of the through hole 268 is filled with pure water or the like thus restricting polishing slurry from entering the through hole 268. This allows the inside of the through hole 268 to be kept transparent, making it possible to perform film measurement using measurement light satisfactorily.

Next, the proximity sensor 222 will be described. The first polishing unit 3A is provided with a dog 224 disposed in the polishing table 30A and a trigger sensor 220 including the proximity sensor 222 disposed outside the polishing table 30A. Examples of possible measuring scheme of the trigger sensor 220 include a scheme using an eddy current occurring in a metallic body to be detected through electromagnetic induction, a scheme capturing a change in electrical capacitance through approach of a detection body.

The dog 224 is pasted to a lower part of the polishing table 30A (lower part where no polishing pad 10 is pasted). The dog 224 is detected by the proximity sensor 222. The proximity sensor 222 is disposed outside the polishing table 30A. The trigger sensor 220 outputs a trigger signal indicating that the polishing table 30A makes one turn based on a positional relationship between the proximity sensor 222 and the dog 224. More specifically, the trigger sensor 220 outputs a trigger signal when the proximity sensor 222 comes closest to the dog 224, or more specifically, the proximity sensor 222 outputs a trigger signal.

The optical sensor 50 determines measurement start timing and measurement end timing based on the trigger signal outputted from the trigger sensor 220 and the angle of rotation 36a of the swing arm 110. That is, the fluid supply control apparatus 27 (a distance determining section) determines a distance from the axis of rotation when the semiconductor wafer 16 is rotated by the top ring 31A to the optical sensor 50 at the time of measurement by the optical sensor 50 based on the trigger signal and the angle of rotation 36a of the swing arm 110. The fluid supply control apparatus 27 determines measurement start timing and measurement end timing using this distance.

The fluid supply control apparatus 27 determines a distance based on an angle of rotation of the optical sensor 50 at the time of measurement from the rotation position which becomes a reference when the optical sensor 50 rotates around the rotation center of the polishing table 30A and a swinging angle of the swing arm 110 at the time of measurement from the swing position which becomes a reference when the swing arm 110 swings around the swing center. Details will be given later.

The fluid supply control apparatus 27 for controlling the supply of a fluid to the through hole 268 supplies the fluid when the determined distance falls within a predetermined range. Note that the fluid supply control apparatus 27 can also determine the distance based on a time required for the optical sensor 50 to rotate from a rotation position which becomes a reference when the optical sensor 50 rotates around the rotation center of the polishing table 30A to a rotation position at the time of measurement and a time required for the swing arm 110 to swing from a swing position which becomes a reference when the swing arm 110 swings around the swing center to a swing position at the time of measurement.

This is because it is possible to calculate an angle of rotation of the optical sensor 50 at the time of measurement from the time required for the optical sensor 50 to rotate up to the rotation position at the time of measurement by controlling (or measuring), for example, the rotation speed of the polishing table 30A. It is also possible to calculate a swinging angle of the swing arm 110 at the time of measurement by controlling (or measuring) the swing speed of the swing arm 110. The rotation speed and the swing speed need not be constant. This is because the angle can be calculated if these speeds are controlled according to a predetermined speed profile.

Next, details of the method for the fluid supply control apparatus 27 to determine the distance from the axis of rotation when the semiconductor wafer 16 is rotated by the top ring 31A to the optical sensor 50 at the time of measurement by the optical sensor 50 based on a trigger signal and the angle of rotation 36a of the swing arm 110 will be described.

Figure 6:
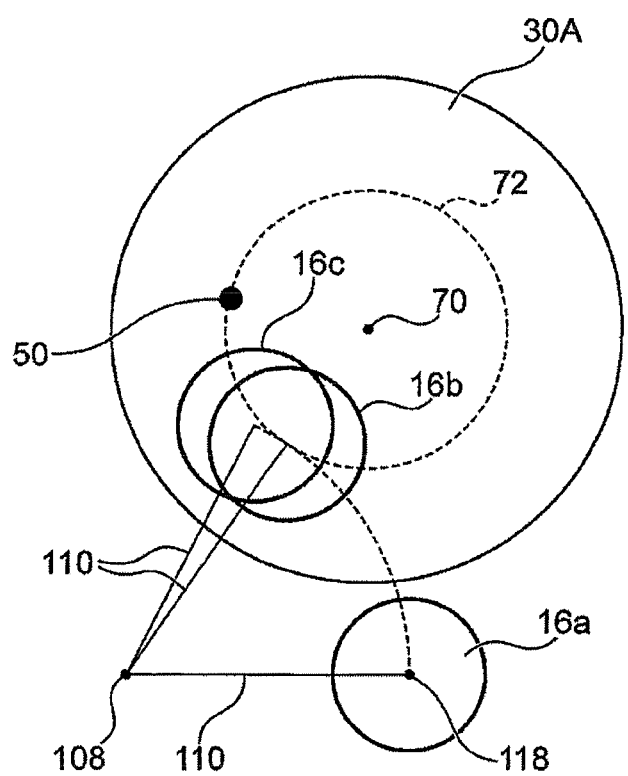
FIG. 6 is a diagram illustrating motion of the swing arm swung during polishing.

First, the track of the optical sensor 50 on the semiconductor wafer 16 when the swing arm 110 is swung during polishing will be described using FIG. 6 and FIG. 7. FIG. 6 is a diagram illustrating motion of the swing arm when the swing arm is swung during polishing. The optical sensor 50 rotates around a rotation center 70 of the polishing table 30A and moves on a circle 72 with a constant radius on the polishing table 30A. The swing arm 110 swings around the axis of rotation 108 (that is, the swing center). As the swing arm 110 rotates, the semiconductor wafer 16 is moved from the receiving position of the semiconductor wafer 16 to above the polishing table 30A. A semiconductor wafer 16a shows the semiconductor wafer 16a located at the receiving position. A semiconductor wafer 16b shows the semiconductor wafer 16 when the optical sensor 50 passes through the center of the semiconductor wafer 16. A semiconductor wafer 16c shows the semiconductor wafer 16 when the optical sensor 50 does not pass through the center of the semiconductor wafer 16.

Figure 7:
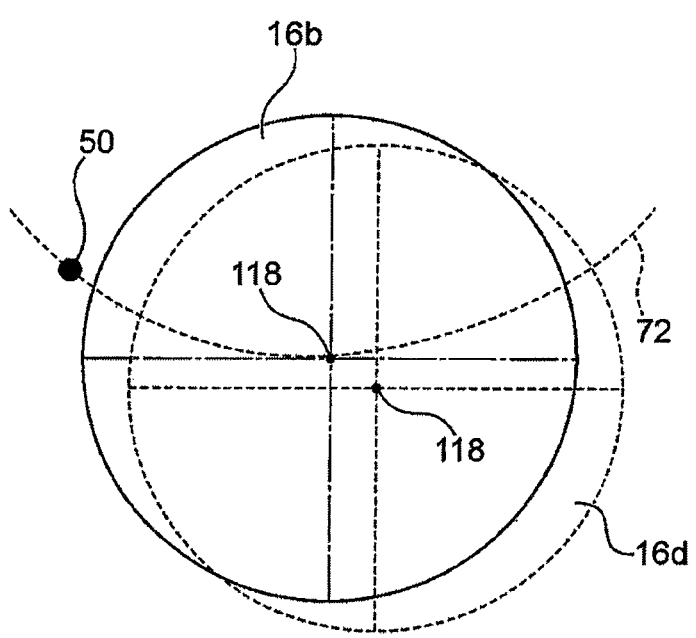
FIG. 7 is a diagram illustrating a track of an optical sensor on a semiconductor wafer when the swing arm is swung during polishing.

An enlarged view of the semiconductor wafer 16 in FIG. 6 is shown in FIG. 7. FIG. 7 is a diagram illustrating the track of the optical sensor 50 on the semiconductor wafer 16 when the swing arm 110 is swung during polishing. The semiconductor wafer 16b shows the semiconductor wafer 16 when the optical sensor 50 passes through the center of the semiconductor wafer 16. The semiconductor wafer 16d shows the semiconductor wafer 16 when the optical sensor 50 does not pass through the center of the semiconductor wafer 16. As is clear from FIGS. 6 and 7, when the top ring 31A swings in the horizontal direction, the track of the optical sensor 50 passing under the semiconductor wafer 16 becomes curves of various sizes passing through points other than the center of the rotation center 118 of the semiconductor wafer 16.

Figure 8:
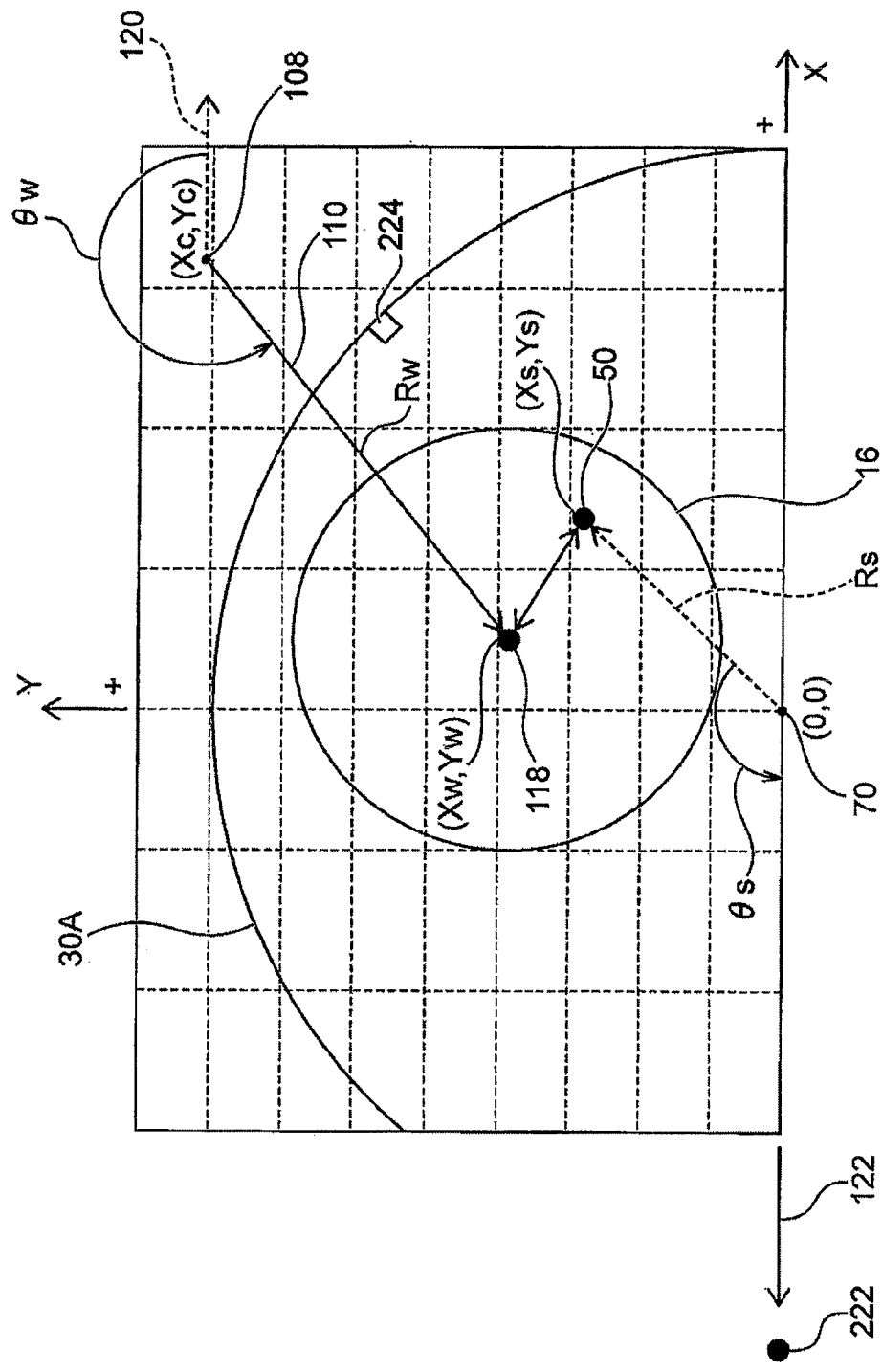
FIG. 8 is a plan view in which the polishing table, the swing arm and the semiconductor wafer are seen from above a first polishing unit.

Next, the method for the distance determining section to determine the distance from the top ring shaft 111 to the optical sensor 50 at the time of measurement by the optical sensor 50 when the semiconductor wafer 16 is rotated by the top ring 31A will be described using FIG. 8. FIG. 8 is a plan view of the polishing table 30A, the swing arm 110 and the semiconductor wafer 16 seen from above the first polishing unit 3A. The rotation center 70 of the polishing table 30A is assumed to be an origin (0, 0) of a coordinate system.

The distance determining section determines the distance based on an angle of rotation θs of the optical sensor 50 at the time of measurement from a rotation position 122 which becomes a reference when the optical sensor 50 rotates around the rotation center 70 of the polishing table 30A and a swinging angle θw of the swing arm 110 at the time of measurement from a swing position 120 which becomes a reference when the swing arm 110 swings around the swing center 108. The distance determining section determines the distance during polishing, that is, when the semiconductor wafer 16 swings around the swing center 108 on the swing arm 110 and when it is rotated by the top ring 31A. The rotation position 122 which becomes a reference is a direction in which the proximity sensor 222 is seen from the rotation center 70. In the present embodiment, the rotation position 122 is made to coincide with the negative direction of the X-axis. The swing position 120 which becomes a reference is a position at which the swing arm 110 receives the semiconductor wafer 16. The rotation position 122 and the swing position 120 which becomes a reference can be set arbitrarily.

Parameters used in the method for determining a distance will be described.

Rotation Radius Rs [mm] of the Optical Sensor 50

The rotation radius Rs is a distance from the rotation center 70 of the polishing table 30A to the optical sensor 50.

The angle of rotation θs [deg] is an angle of rotation of the optical sensor 50 calculated, when a time at which the proximity sensor 222 outputs a trigger signal is measured, from the product of the rotation angular speed of the polishing table 30A and time. The rotation angular speed of the polishing table 30A is normally a constant value. When it is not a constant value, the rotation angular speed can be calculated by adding up the rotation angular speed and the time (or by integrating the rotation angular speed by time). Note that since the rotation position 122 which becomes a reference is in a direction in which the proximity sensor 222 is seen from the rotation center 70, the dog 224 is on a radius connecting the rotation center 70 and the optical sensor 50 accordingly. Note that the dog 224 can be provided at an arbitrary position. When the dog 224 is not located on the radius connecting the rotation center 70 and the optical sensor 50, an angle formed by the radius connecting the rotation center 70 and the optical sensor 50 and the radius connecting the rotation center 70 and the dog 224 may be added to or subtracted from the angle of rotation of the optical sensor 50 calculated from the product of the aforementioned rotation angular speed of the polishing table 30A and time.

X coordinate Xc [mm] of axis of rotation 108 of swing arm 110

Y coordinate Yc [mm] of axis of rotation 108 of swing arm 110

Rotation Radius Rw [mm] of Swing Shaft of Swing Arm 110

The rotation radius Rw is a distance from the axis of rotation 108 of the swing arm 110 to the rotation center 118 of the semiconductor wafer 16.

Swinging Angle θw [deg] Measured from Reference Position of Swing Arm 110

The swinging angle θw is obtained by subtracting the angle of rotation 36a corresponding to the swing position 120 which becomes a reference from the aforementioned angle of rotation 36a corresponding to the swing arm 110 at the time of measurement.

When parameters are set in this way, X coordinate Xs [mm] and Y coordinate Ys [mm] of the optical sensor 50 are calculated as follows.

$$Xs = Rs * \cos(\theta s)$$

$$Ys = Rs * \sin(\theta s)$$

The X coordinate Xw [mm] and Y coordinate Yw [mm] of the rotation center 118 of the semiconductor wafer 16 are calculated as follows.

$$Xw = Xc + Rw * \cos(\theta w)$$

$$Yw = Yc + Rw * \sin(\theta w)$$

Note that the swing position 120 coincides with a positive direction of the X-axis according to the present embodiment. When the swing position 120 does not coincide with the positive direction of the X-axis, the angle formed by the swing position 120 and the positive direction of the X-axis may be added to or subtracted from the swinging angle θw.

A distance Ds between the optical sensor 50 and the rotation center 118 of the semiconductor wafer 16 is calculate as follows:

$$Ds=\sqrt{\{(Xs-Xw)^2+(Ys-Yw)^2\}}$$

The fluid supply control apparatus 27 is assumed to calculate the distance Ds as described above, but the end point detection section 28 may also calculate the distance Ds. When either the fluid supply control apparatus 27 or the endpoint detection section 28 calculates the distance Ds, the apparatus that has calculated the distance Ds can send the calculation result to the other apparatus. Furthermore, both the fluid supply control apparatus 27 and the endpoint detection section 28 may calculate the distance Ds in parallel. In this case, when one apparatus calculates more quickly than the other apparatus, the one apparatus can know the distance Ds without waiting for the other apparatus to end the calculation, and so the processing is carried out faster.

The above-described method for calculating the distance Ds uses the angle of rotation θs of the polishing table 30A and the angle of rotation θw of the swing arm 110, but there are various methods for calculating the distance Ds. For example, it is possible to determine the distance based on a time required for the optical sensor 50 to rotate from the rotation position 122 which becomes a reference when the optical sensor 50 rotates around the rotation center 70 of the polishing table 30A to the rotation position at the time of measurement and a time required for the swing arm 110 to swing from the swing position 120 which becomes a reference when the swing arm 110 swings around the swing center 108 to the swing position at the time of measurement.

Figure 9:
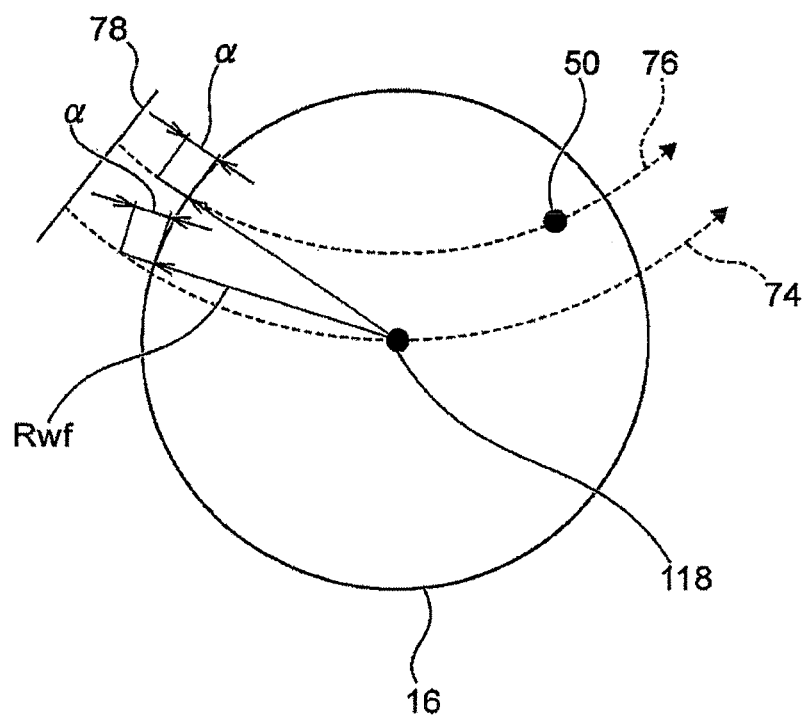
FIG. 9 is a diagram illustrating a track of the optical sensor on the semiconductor wafer when the swing arm is swung during polishing.

Next, the method for controlling a fluid using the distance Ds by the fluid supply control apparatus 27 will be described using FIG. 9 and FIG. 10. FIG. 9 is a diagram illustrating a track of the optical sensor 50 on the semiconductor wafer 16 when the swing arm 110 is caused to swing during polishing. A track 74 shows a moving path of the optical sensor 50 when the optical sensor 50 passes through the center of the semiconductor wafer 16. A track 76 shows a moving path of the optical sensor 50 when the optical sensor 50 does not pass through the center of the semiconductor wafer 16. FIG. 9 also shows the location of timing 78 at which the trigger sensor 220 outputs a trigger signal on the track 74 and the track 76.

When the determined distance Ds falls within a predetermined range, the fluid supply control apparatus 27 for controlling the supply of a fluid to the through hole 268 preferably supplies the fluid. When the fluid is supplied to the through hole 268, the supply is preferably started immediately before the optical sensor 50 enters an area below the semiconductor wafer 16 and stopped immediately after the optical sensor 50 comes out from below the semiconductor wafer 16.

That is, when the calculated distance Ds between the rotation center 118 of the semiconductor wafer 16 and the optical sensor 50 is equal to or less than the radius of the semiconductor wafer 16 Rwf+set value α (predetermined length) (that is, within a predetermined range) as shown in FIG. 9, a necessary fluid is supplied to the optical sensor 50. By adjusting the set value α, supply timing can be adjusted. FIG. 10 illustrates timing for supplying the necessary fluid to the optical sensor 50. In the respective drawings in FIG. 10, the horizontal axis represents time and the vertical axis represents, for example, a binary value of "0" and "1."

Figure 10:
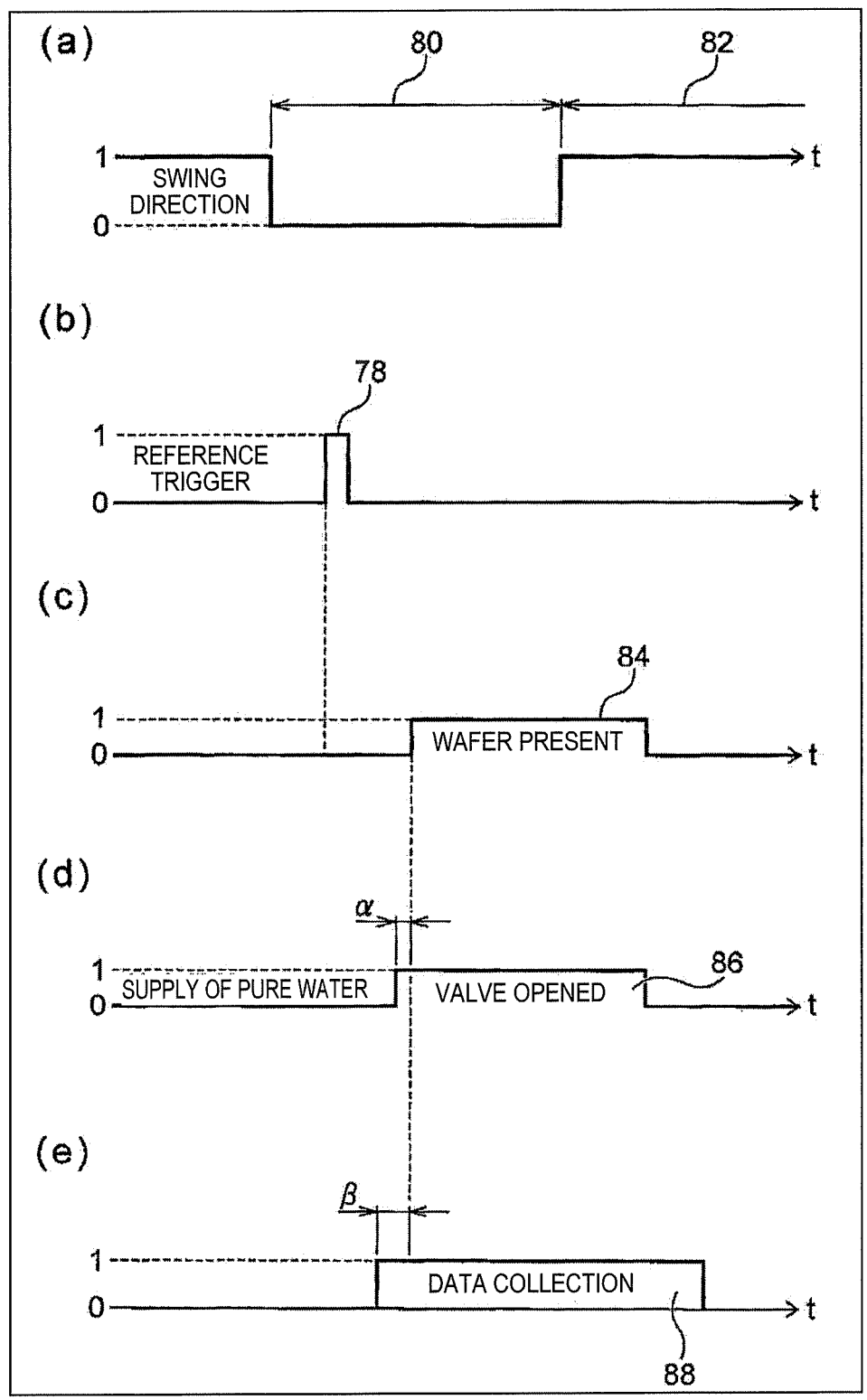
FIG. 10 is a diagram illustrating timing for supplying a fluid to the optical sensor.

FIG. 10(*a*) illustrates the swing direction of the swing arm 110. "1" and "0" indicate mutually opposite swing directions. The lengths of a period 80 of "1" and a period 82 of "0" may be the same or different. FIG. 10(*b*) illustrates timing 78 at which the trigger sensor 220 outputs a trigger signal. "1" indicates that a trigger signal is outputted. FIG. 10(*c*) illustrates timing 84 during which the optical sensor 50 is located below the semiconductor wafer 16. "1" indicates that the optical sensor 50 is located below the semiconductor wafer 16.

FIG. 10(*d*) illustrates timing 86 during which a necessary fluid is supplied to the optical sensor 50. "1" indicates that the necessary fluid is supplied to the optical sensor 50. The timing 86 starts earlier than the timing 84. The period during which the timing 86 precedes the timing 84 corresponds to the set value α. FIG. 10(*e*) illustrates a period 88 during which the optical sensor 50 collects data. "1" indicates that the optical sensor 50 collects data. The period 88 is set to be wider than the timing 84 and the timing 86 by a set value β. This is done to ensure that the data is reliably collected.

Note that in addition to controlling the timing 86 at which the necessary fluid is supplied to the optical sensor 50, control may be performed so that the flow rate is changed between the center of the semiconductor wafer 16 and the edge side based on the radius position of the optical sensor 50 which performs calculations all the time. In order to perform accurate measurement using the optical sensor 50, the through hole 268 needs to be filled with a sufficient amount of fluid. For this reason, when the optical sensor 50 enters an area below the semiconductor wafer 16 from the outside of the semiconductor wafer 16, for example, a higher flow rate is set and slurry is excluded first. In the vicinity of the center of the semiconductor wafer 16, an effect of reducing influences of the fluid on the polishing is produced by setting a lower flow rate. That is, the fluid supply control apparatus 27 supplies the fluid with a first supply amount (liters/minute) for a predetermined period after the determined distance Ds falls within a predetermined range (equal to or less than the sum of the radius of the semiconductor wafer 16 Rwf and the set value α) and the supply of the fluid is started. After a lapse of the predetermined period, the fluid is supplied with a second supply amount (liters/minute) smaller than the first supply amount.

Figure 11:
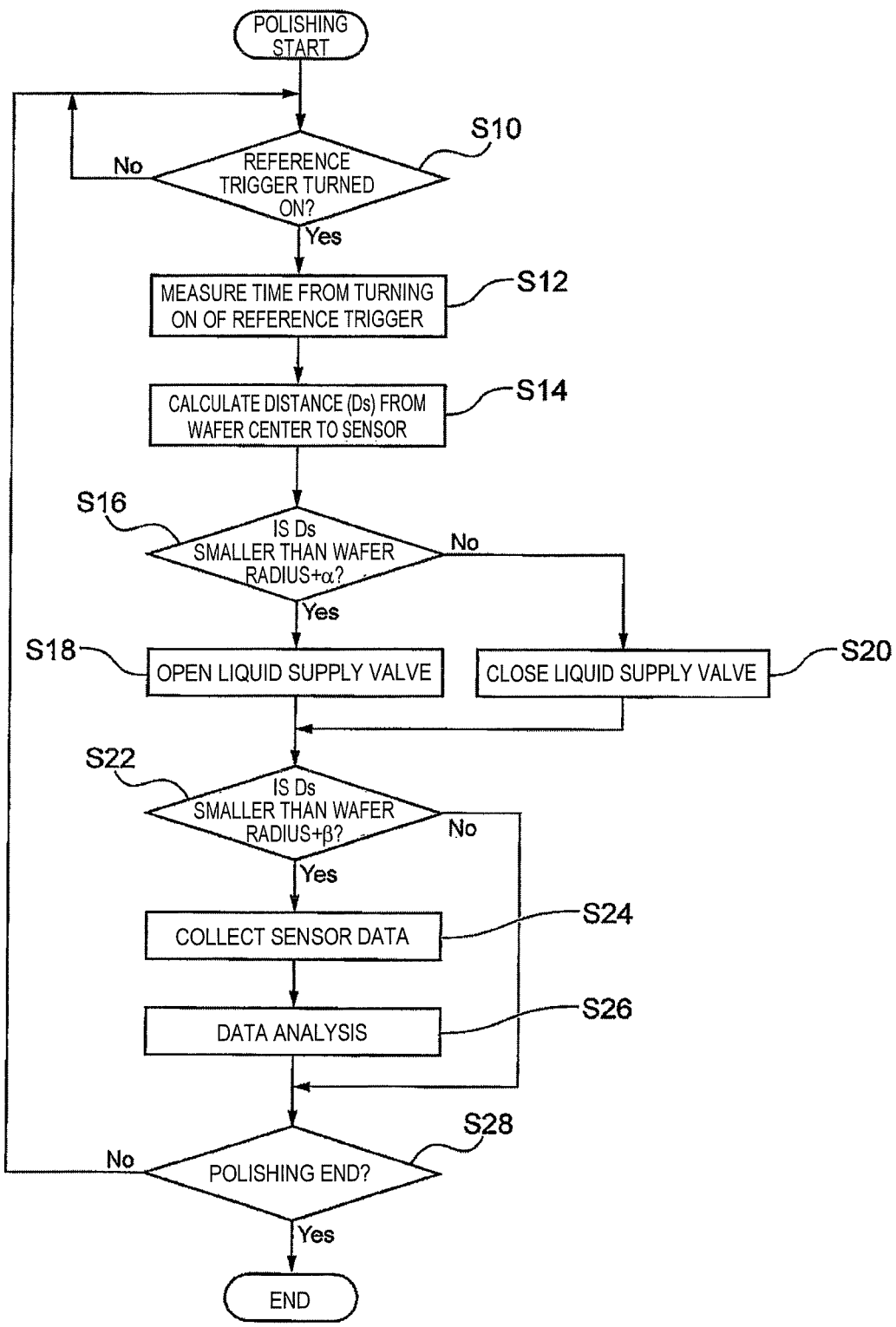
FIG. 11 is a flowchart illustrating a procedure for data collection by the optical sensor and an analysis of the data obtained.

Next, data collection by the optical sensor 50 and a data analysis procedure according to the present embodiment will be described using a flowchart in FIG. 11. In this procedure, a data analysis is performed every time data is acquired. When polishing starts, it is determined whether or not a trigger signal is outputted from the proximity sensor 222 (whether or not a reference trigger is turned ON) (S10). When the trigger signal is not outputted, this determination is repeated until the trigger signal is outputted. When the trigger signal is outputted, time after the reference trigger is turned ON is measured (S12). The distance Ds from the rotation center 118 of the semiconductor wafer 16 to the optical sensor 50 is calculated using this time as described above (S14).

Next, it is determined whether or not the distance Ds is smaller than the radius of the semiconductor wafer 16 (Rwf)+α (S16). When the distance Ds is smaller (Yes), the fluid supply control apparatus 27 opens the supply control valve 256 and supplies the liquid (S18). When the distance Ds is greater (No), the fluid supply control apparatus 27 closes the supply control valve 256 and does not supply the liquid (S20). Next, it is determined whether or not the distance Ds is smaller than the radius of the semiconductor wafer 16 (Rwf)+β (S22). When the distance Ds is greater (No), no measurement by the optical sensor 50 is performed. When the distance Ds is smaller (Yes), measurement by the optical sensor 50 is performed (S24). The end point detection section 28 performs end point detection using the data obtained (S26). It is determined whether or not the polishing is ended based on the result of end point detection (S28). When it is determined that the polishing is ended (Yes), the polishing ends. When it is determined that the polishing is not ended (No), the process returns to step S10 and the polishing continues.

Figure 12:
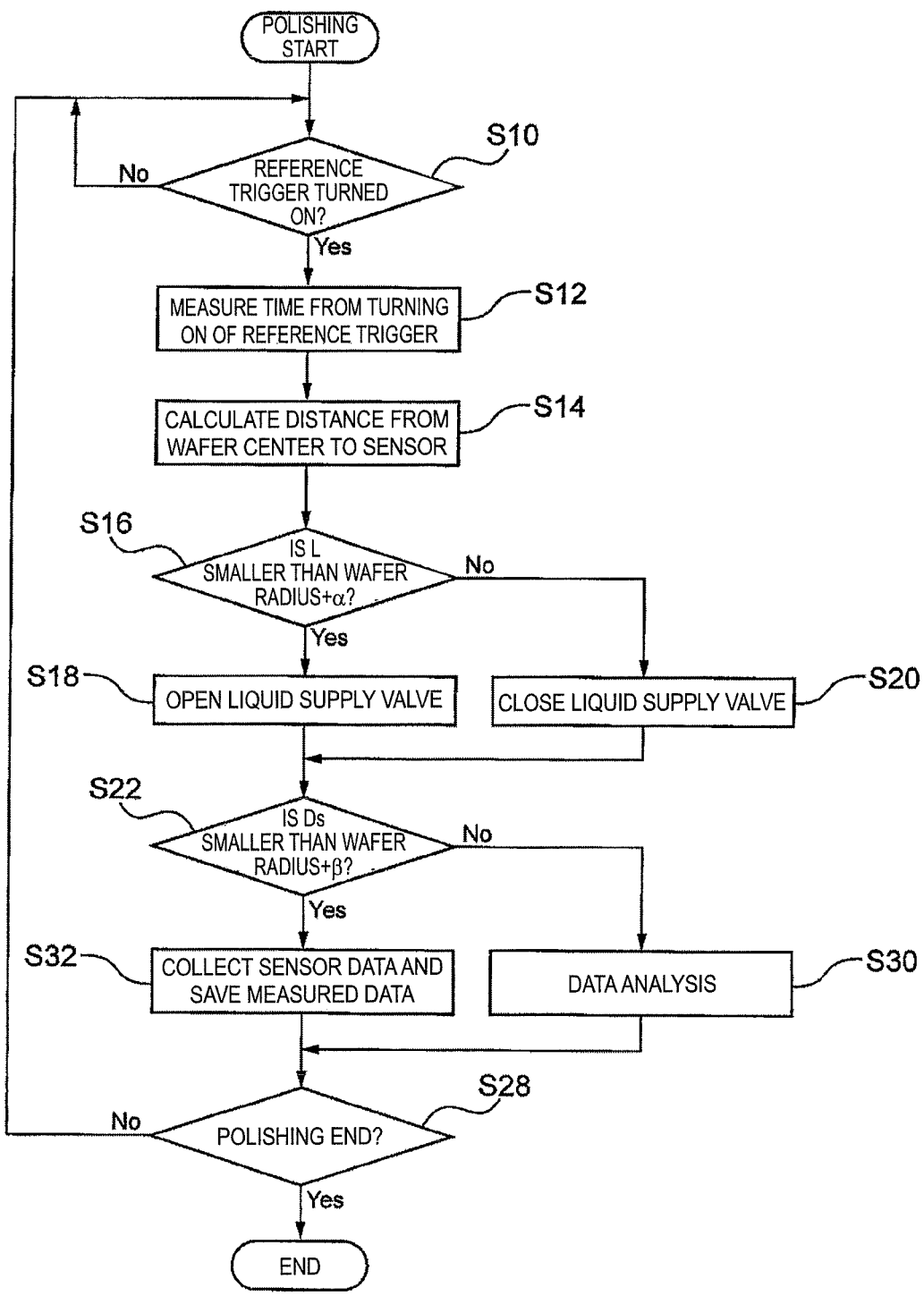
FIG. 12 is a flowchart illustrating a procedure for data collection by the optical sensor and an analysis of the data obtained.

Next, data collection and another data analysis procedure by the optical sensor 50 according to the present embodiment will be described using a flowchart in FIG. 12. In this procedure, all the data obtained while the polishing table 30A makes one turn is obtained and then a data analysis is performed. No data analysis is performed while data is being collected. This can give more processing time than when a data analysis is performed every time data is acquired.

In the present procedure, step S10 to step S20 are the same as the procedure shown in FIG. 11, and so step S20 and subsequent steps will be described. When step S18 or step S20 ends, it is then determined whether or not the distance Ds is smaller than the radius of the semiconductor wafer 16 (Rwf)+β (S22). When the distance Ds is greater (No), measurement by the optical sensor 50 is not performed. Since all the latest data obtained while the polishing table 30A makes one turn is obtained, the end point detection section 28 performs endpoint detection on the data (S30). When the distance Ds is smaller (Yes), measurement by the optical sensor 50 is performed and data obtained is saved (S32). Next, it is determined whether or not the polishing is ended according to the result of end point detection (S28). When it is determined that the polishing is ended (Yes), the polishing ends. When it is determined that the polishing is not ended (No), the process returns to step S10 and the polishing continues.

Note that although the position of the swing arm 110 is determined using the angle of rotation 36a according to the aforementioned embodiment, other methods can also be used. For example, when the motion of the swing arm 110 follows a predetermined profile, if timing at which the swing arm 110 changes the swing direction is known, it is possible to determine, through calculation, the position of the swing arm 110 by measuring an elapsed time after changing the swing direction. The timing at which the swing arm 110 changes the swing direction can be obtained from the control section that controls driving of the swing arm 110. Furthermore, by providing the trigger sensor 220 at a swing end of the swing arm 110, it is possible to directly detect timing at which the swing arm 110 changes the swing direction.

The embodiments of the present invention have been described so far, but the above-described embodiments of the present invention are meant to facilitate an understanding of the present invention, and not to limit the present invention. The present invention can be changed or improved without departing from the spirit and scope of the present invention and it goes without saying that the present invention includes equivalents thereof. An arbitrary combination or omission of components described in the scope of claims and the specification is possible within a scope in which at least some of the above-described problems can be solved or within a scope in which at least some of the effects can be exerted.

This application claims priority under the Paris Convention to Japanese Patent Application No. 2017-202620 filed on Oct. 19, 2017. The entire disclosure of Japanese Patent Laid-Open Nos. 2006-526292 and 2012-135865 including specification, claims, drawings and summary is incorporated herein by reference in its entirety.

REFERENCE SIGNS LIST

14 . . . Swing shaft motor
16 . . . Semiconductor wafer
18a . . . Current command
18b . . . Current value
27 . . . Fluid supply control apparatus
28 . . . End point detection section
30A . . . Polishing table
36a . . . Angle of rotation
50 . . . Optical sensor
70 . . . Rotation center
108 . . . Swing center
222 . . . Proximity sensor
224 . . . Dog
242 . . . Supply path
244 . . . Exhaust path
250 . . . Fluid supply section
256 . . . Supply control valve
268 . . . Through hole
270 . . . Light projecting optical fiber
272 . . . Light receiving optical fiber

What is claimed is:

1. A polishing apparatus configured to perform polishing between a polishing pad and a polishing object disposed opposite to the polishing pad, comprising:
a rotatable polishing table configured to hold the polishing pad;
a rotatable holding unit configured to hold the polishing object;
a swing arm holding the holding unit;
an arm drive section configured to swing the swing arm around a center of swinging on the swing arm during the polishing;
a measuring unit disposed on the polishing table, and configured to measure a physical quantity of the polishing object changeable in accordance with a change in film thickness of the polishing object;
a controller comprising:
a distance determining section configured to determine a distance from an axis of rotation when the polishing object is rotated by the holding unit, to the measuring unit at the time of measurement by the measuring unit, when the polishing object is swung around the center of swinging on the swing arm and rotated by the holding unit; and
an end point detection section configured to detect a polishing end point indicating an end of the polishing based on the physical quantity measured by the measuring unit and the determined distance.

2. The polishing apparatus according to claim 1, wherein the distance determining section is configured to determine the distance based on an angle of rotation of the measuring unit at the time of measurement from a rotation position which becomes a reference when the measuring unit rotates around a rotation center of the polishing table and a swing angle of the swing arm at the time of measurement from the swing position which becomes a reference when the swing arm swings around the swing center.

3. The polishing apparatus according to claim 1, wherein the distance determining section is configured to determine the distance based on a time required for the measuring unit to rotate from a rotation position which becomes a reference when the measuring unit rotates around a rotation center of the polishing table to a rotation position at the time of measurement and a time required for the swing arm to swing from a swing position which becomes a reference when the swing arm swings around the swing center to the swing position at the time of measurement.

4. The polishing apparatus according to claim 1, wherein the measuring unit comprises:
   a light projecting/receiving apparatus configured to project measurement light from the polishing table onto the polishing object and receive reflected light from the polishing object;
   a fluid supply section configured to supply a fluid to a fluid chamber provided in a light projecting/receiving location of the polishing table; and
   a fluid supply control apparatus configured to control the fluid supply to the fluid chamber, wherein
   the fluid supply control apparatus supplies the fluid when the determined distance falls within a predetermined range.

5. The polishing apparatus according to claim 4, wherein when the determined distance falls within the predetermined range means when the determined distance is equal to or less than a length obtained by adding up the radius of the polishing object and a predetermined length.

6. The polishing apparatus according to claim 4, wherein the fluid supply control apparatus supplies the fluid with a first supply amount for a predetermined period after the determined distance falls within the predetermined range and the fluid supply is started and supplies the fluid with a second supply amount which is smaller than the first supply amount after a lapse of the predetermined period.

7. A polishing method for performing polishing between a polishing pad and a polishing object disposed opposite to the polishing pad, the method comprising:
   holding the polishing pad to a polishing table and rotating the polishing table;
   holding the polishing object to a holding unit and rotating the holding unit;
   holding the holding unit using a swing arm and causing the swing arm to swing around a center of swinging on the swing arm during the polishing;
   measuring a physical quantity of the polishing object changeable in accordance with a change in film thickness of the polishing object using a measuring unit disposed on the polishing table;
   determining a distance from an axis of rotation when the polishing object is rotated by the holding unit, to the measuring unit at the time of measurement by the measuring unit, when the polishing object is swung around the center of swinging on the swing arm and rotated by the holding unit; and
   detecting a polishing end point indicating an end of the polishing based on the measured physical quantity and the determined distance.

* * * * *